United States Patent [19]

Polcyn

[11] 4,395,585

[45] Jul. 26, 1983

[54] MULTIPLE USE COMPONENT SPACER AND METHODS FOR PREPARING A SPACER FOR MOUNTING ON AND AFFIXING A SPACER TO A CIRCUIT BOARD

[75] Inventor: Erwin R. Polcyn, Scottsdale, Ariz.

[73] Assignee: Motorola Inc., Schaumburg, Ill.

[21] Appl. No.: 322,969

[22] Filed: Nov. 19, 1981

[51] Int. Cl.³ .................. H05K 7/08; H05K 3/30
[52] U.S. Cl. .................. 174/138 G; 29/832; 361/403
[58] Field of Search .................. 174/138 G, 146; 361/403, 418; 29/832, 834, 837, 838

[56] References Cited

U.S. PATENT DOCUMENTS

| | | | |
|---|---|---|---|
| 1,089,642 | 3/1914 | Honold | 174/146 X |
| 2,880,262 | 3/1959 | Bell et al. | 361/417 X |
| 3,043,902 | 7/1962 | Klein | 174/146 |
| 3,263,200 | 7/1966 | Kocmich | 174/138 G X |
| 3,342,168 | 9/1967 | Burdette | 174/146 X |
| 3,962,719 | 6/1976 | Pfaff | 174/138 G X |

OTHER PUBLICATIONS

*Electronic Design*, Jan. 22, 1958, p. 88.
Jones, N. G., *IBM Technical Disclosure Bulletin*, vol. 8, No. 9, Feb. 1966, p. 1298.

*Primary Examiner*—Laramie E. Askin
*Attorney, Agent, or Firm*—Lewis S. Gruber; Eugene A. Parsons

[57] ABSTRACT

A multiple use component spacer having a component platform defining an aperture, having a plurality of lead grasping portions each having forked resilient portions defining a lead receiving slot for firm engagement with the leads of a range of packages without requiring the use of adhesives, having a plurality of lead abutment portions on its circumference, and having a plurality of feet on at least one surface.

5 Claims, 8 Drawing Figures

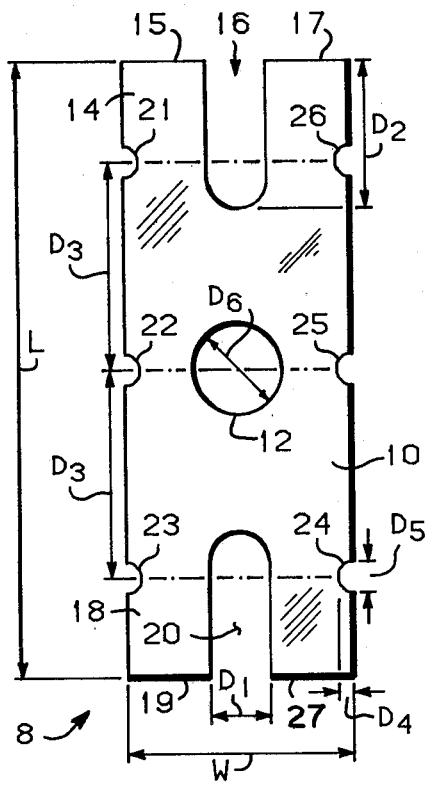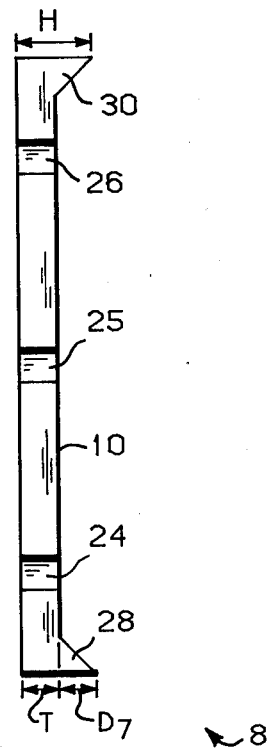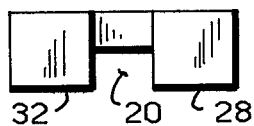
FIG 1   FIG 2
FIG 3

MULTIPLE USE COMPONENT SPACER AND METHODS FOR PREPARING A SPACER FOR MOUNTING ON AND AFFIXING A SPACER TO A CIRCUIT BOARD

FIELD OF THE INVENTION

The present invention relates to electronic component mounting hardware and more particularly to printed circuit board spacers suitable for use with components having a variety of lead configuration and lead diameters.

Mounting pads provide many advantages, including: insulation of the component from the board; ventilation of the component; easy access for test probing, lead inspection, and component removal; clearance for a plastic package meniscus; protection against shock and vibration; and facilitation of cleaning of circuit boards under and around components. A wide variety of mounting pads or spacers is available.

Most available component mounts have a shape and a pattern of holes or slots designed to accommodate a particular lead configuration on a particular shape of component. Some component spacers, which are advanced as being of universal use, are interchangeable among devices having widely varying shapes, lead configurations, and lead diameters by virtue of the fact that they comprise separate nylon tubes or clusters of tubes which fit very loosely around leads.

Available component spacers are designed to fit loosely around the leads of the spaced component and, therefore, must be applied at the time of the insertion of the leads of the component into the board. Furthermore, especially to the extent that available spacers are interchangeable among component having a wide range of lead configurations and diameters, available spacers fit too loosely to withstand handling after insertion.

SUMMARY OF THE INVENTION

Accordingly it is an object of the present invention to provide a new and improved component spacer.

It is a further object of the present invention to provide a new and improved component spacer which exerts pressure on the leads of the component to which it is applied so that the spacer is retained by the component leads during handling.

Still a further object of the present invention is to provide a new and improved component spacer that is adapted for use with components having a range of lead diameters and lead configurations.

These and other objects of the present invention will become apparent to those skilled in the art upon consideration of the accompanying specification, claims and drawings.

One advantage of the present invention is the ability to be applied with good retention to a component at any stage of the assembly process. This feature is applicable to and simplifies automated assembly and automated insertion.

Another advantage of the present invention is the reduction in inventory, purchasing, storage and labor costs arising from the ability to use the present invention on a variety of components.

A further advantage of the present invention is the ability to use the present invention in space-limited applications.

In order to attain the above-mentioned and other objects and advantages, the present invention comprises a component spacer having a central portion and a plurality of lead grasping portions extending from said central portion.

BRIEF DESCRIPTION OF THE DRAWINGS

FIG. 1 is a top view of a device embodying the present invention;

FIG. 2 is a side view of the embodiment of FIG. 1;

FIG. 3 is an end view of the embodiment of FIG. 1;

DESCRIPTION OF THE PREFERRED EMBODIMENT

Figure 4:
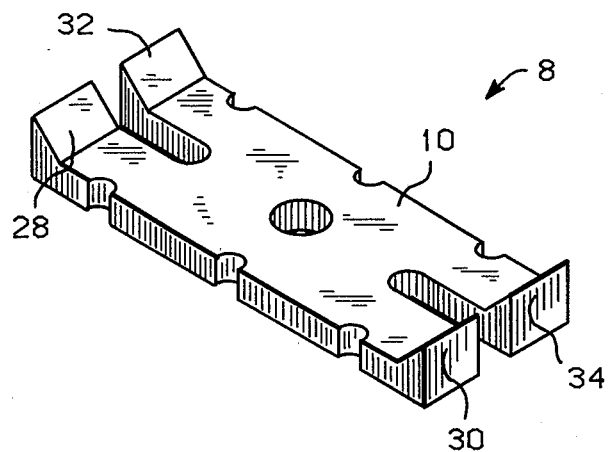
FIG. 4 is a perspective view of the embodiment of FIG. 1.

In a preferred embodiment of the multiple use spacer as illustrated in FIG. 1, a spacer 8 can be described in terms of a central portion 10 forming a component platform and having an aperture 12, forked, lead grasping portion 14 having furcations 15 and 17 which are separated by slot 16, and forked lead grasping portion 18 having furcations 19 and 27 which are separated by slot 20. The slot 16 between furcations 15 and 17 and the slot 20 between furcations 19 and 27, extends longitudinally from the proximal ends of the furcations, adjacent the central portion 10, outwardly to the distal ends of the furcations at the outermost extremes thereof. Each of the furcations 15, 17, 19 and 27 has a foot, 28, 30, 32 and 34, respectively, projecting generally perpendicularly outwardly therefrom and generally perpendicular to the plane of the central portion 10. The feet 28, 30, 32 and 34, which can be seen in FIG. 4, elevate the spacer 8 above a printed circuit board so that solder joints, terminals, etc. are accessible thereunder. Lead abutment niches 21, 22, 23, 24, 25, and 26 are distributed around the circumference of spacer 8 at equal intervals $D_3$ and act to grasp leads by slightly spreading them. The slight spreading action of the lead abutment portions of the present invention differs from the gross lead deformation found in component spacers designed to spread leads from a first to a second configuration. Unlike the component spreaders, which may incidentally provide some lead retention, the abutment niches of the present invention are not oriented so as to deform leads to fit into differently configured holes on a circuit board.

Figure 5:
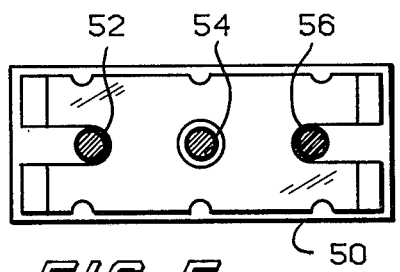
FIG. 5 is a bottom view of a component showing leads in one configuration being grasped by the FIG. 1 embodiment of the present invention.

FIG. 5 illustrates the use of the preferred embodiment which an electrical component 50 having three leads, 52, 54 and 56, in a straight line, such as found on some types of variable resistors. The central lead of the component passes through the central aperture of the spacer without being grasped thereby. It should be noted that the width of the slots 16 and 20 separating furcations 15, 17 and 19, 27 respectively, are formed slightly smaller than the diameter of aperture 12 and the same size or smaller than the diameter of leads (e.g. leads 52 and 56) to be grasped thereby. Thus, when leads 52 and 56 are inserted in slots 16 and 20 furcations 15, 17, and 19, 27, respectively, are spread slightly. This slight spreading provides a frictional grasping force on leads 52 and 56. Spacer 8 should be formed from an at least partially resilient material to provide the frictional grasping action. It will be understood by those skilled in the art that the spacer 8 provides the desired frictional grasping action on the leads of any component, which leads have a diameter that is equal to or exceeds the unspread width of slots 16 and 20 and which can be forced into the slots 16 and 20. Thus, the range of acceptable lead diameters for frictional grasping is dictated by the original width of the slots and the resiliency of the material forming the spacer. Also, the longitudinal spacing and length of the slots 16 and 20 dictate the allowable spacing between component leads and the range of differently spaced component leads that can be utilized with any single embodiment of spacer 8.

Figure 6:
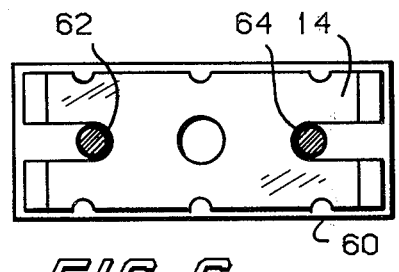
FIG. 6 is a bottom view of a component showing leads in a second configuration being grasped by the FIG. 1 embodiment of the present invention.

FIG. 6 depicts the use of the preferred embodiment with an electrical component 60 having two leads, 62 and 64, in line, such as some types of capacitor packages. The two leads are grasped by the lead grasping portions 14 and 18 at either end of the spacer, and the central aperture and niches of the spacer remain unused.

Figure 7:
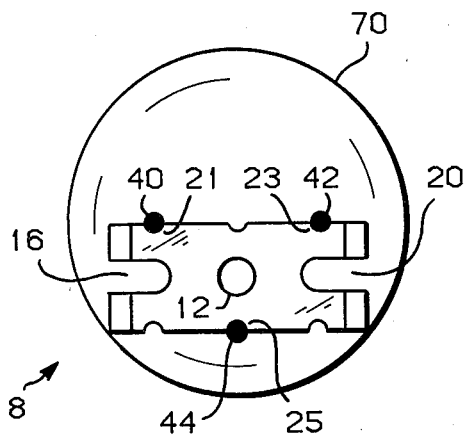
FIG. 7 is a bottom view of a component showing the FIG. 1 embodiment of the present invention firmly engaging leads in a third configuration.

In FIG. 7 the preferred embodiment is shown in use with an electrical component 70 having a triangular lead configuration, such as is found on some types of transistors. Retention of the spacer by component 70 is accomplished by pressing the spacer between the leads so that lead 40 is tightly pressed into niche 21, lead 42 is tightly pressed into niche 23 and lead 44 is tightly pressed into niche 25. In this configuration the spacer 8 produces a slight spreading action on the leads 40, 42 and 44 causing the leads to grasp the spacer 8. The slots 16 and 20 and central aperture 12 of the spacer 8 remain unused in this configuration.

The spacer 8 may be made from any material suitable to the application, which in most cases involves an electrically insulating, temperature stable, semi-resilient material. Although the preferred embodiment has been implemented in a molded polybutylene terephthalate, 30% glass filled, one skilled in the art understands that other materials, such as an acetal or nylon, may be used and that other methods of formation, such as coating, extruding, etc., may be used.

The preferred embodiment of the present invention has been implemented in a structure having dimensions as shown in FIGS. 1 and 2 as listed in Table I.

TABLE I

| Dimension | Measurement | |
|---|---|---|
| | In Inches | (In mm) |
| L | 0.300 | (7.62) |
| W | 0.100 | (2.54) |
| H | 0.040 | (1.02) |
| T | 0.020 | (0.51) |
| $D_1$ | 0.023 | (0.58) |
| $D_2$ | 0.070 | (1.78) |
| $D_3$ | 0.100 | (2.54) |
| $D_4$ | 0.005 | (0.13) |
| $D_5$ | 0.010 | (0.25) |
| $D_6$ | 0.030 | (0.76) |
| $D_7$ | 0.020 | (0.51) |

By way of an example, the embodiment of the present invention implemented as delimited in Table I may be applied to a transistor in a TO-5 package as illustrated in FIG. 7. The lead grasping slots of the embodiment dimensioned in Table I would accommodate a maximum lead spacing on the order of 0.300 inches and a minimum lead spacing of about 0.160 inches.

Figure 8:
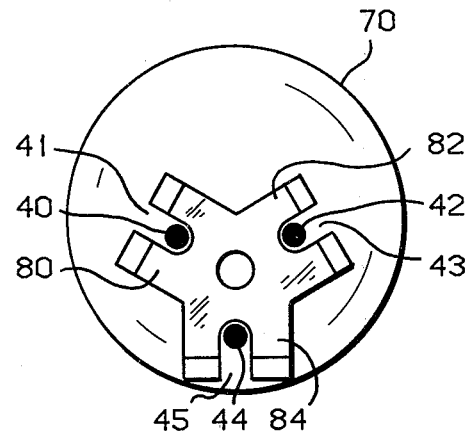
FIG. 8 is a bottom view of the component of FIG. 7 showing another embodiment of the present invention firmly engaging leads in the configuration of FIG. 7.

While the present invention has been described in terms of a preferred embodiment, further modifications and improvements will occur to those skilled in the art. Such variations include changing the number and placement of abutment niches, changing the number, placement and size of apertures in the central portion, changing the number, placement and size of the lead grasping portions, and increasing or decreasing the overall size of the spacer for use with varying combinations of components. For example, an embodiment of the present invention having three lead grasping portions 80, 82 and 84 with three slots 41, 43 and 45 respectively, radiating outwardly in 120° spaced relationship is shown in FIG. 8. The slots operate as described for the slots 16 and 20 of spacer 8 to grasp the triangularly situated leads 40, 42 and 44 of component 70. The embodiment of FIG. 8 can also be applied to many common header integrated circuit packages. Of course, such packages may also be spaced by applying the embodiment of FIG. 1 diagonally across the lead configuration if slots having suitable dimensions are used.

Furthermore, additional uses for the present invention will occur to those skilled in the art. For example, the open ends of lead grasping slots provide inspection windows for examining solder joints in addition to those provided by the use of feet to elevate a component from a circuit board. By way of another example, the multiple use capability of the present invention would induce one skilled in the art to use the present invention with components having axial leads by bending the leads perpendicular to the axis and grasping the perpendicular portions of the leads with the lead grasping portions of the present invention.

I desire it to be understood, therefore, that this invention is not limited to the particular form shown and I intend in the appended claims to cover all such equivalent variations which come within the scope of the invention as described.

I claim:

1. A multiple use component spacer, having a circumference and a plurality of surfaces for use in conjunction with a circuit board and components to be mounted on said board, said spacer comprising:
    a central portion having a component platform surrounding a lead receiving aperture suitable for passing a lead to be soldered to the circuit board;
    a first lead grasping portion affixed to said central portion, directed outwardly therefrom in a first direction and having a resilient forked portion defining a lead receiving slot;
    a second lead grasping portion having a resilient forked portion defining a lead receiving slot affixed to said central portion and directed outwardly therefrom in a direction different from that of said first lead grasping portion;
    a plurality of lead abutment portions distributed about the circumference of the spacer; and
    means for providing elevation of said component platform above a circuit board, said means for providing elevation being located on at least one of the surfaces of the spacer.

2. The multiple use component spacer as recited in claim 1 wherein said means for providing elevation comprises a plurality of feet.

3. A multiple use component spacer having a circumference and a plurality of surfaces for use in conjunction with a circuit board and components to be mounted thereon, comprising:
- a component platform defining a lead receiving aperture;
- a plurality of resilient forked lead grasping portions affixed to and directed outwardly from said component platform;
- each of said forked resilient portions defining a lead receiving slot for providing a grasping action;
- a plurality of lead abutment portions on the circumference of the spacer for restraining movement of the spacer by pressing against the leads of a component; and
- a plurality of feet projecting from at least one surface of the spacer farther in at least one direction than any other portion of the spacer.

4. A method of affixing a component having leads to a circuit board in spaced relationship from the circuit board comprising the steps of:
- providing a multiple use component spacer having a circumference, having lead grasping portions, having a central aperture and having abutment niches about said circumference;
- grasping at least one lead of the component with at least one of said lead grasping portions and passing at least one lead of the component through said central aperture; and
- affixing the component to the board with the spacer positioned between the component and the board.

5. A method of preparing a component for mounting on a circuit board comprising the steps of:
- providing a multiple use component spacer having a circumference, having a plurality of lead grasping portions, having a central aperture and having abutment niches about said circumference; and
- grasping at least one lead of the component with at least one of said plurality of lead grasping portions and passing at least one lead of the component through said central aperture.

* * * * *